United States Patent
Cappellani et al.

(10) Patent No.: US 9,425,212 B2
(45) Date of Patent: Aug. 23, 2016

(54) ISOLATED AND BULK SEMICONDUCTOR DEVICES FORMED ON A SAME BULK SUBSTRATE

(75) Inventors: Annalisa Cappellani, Portland, OR (US); Kelin J. Kuhn, Aloha, OR (US); Rafael Rios, Portland, OR (US); Harry Gomez, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 372 days.

(21) Appl. No.: 13/538,822

(22) Filed: Jun. 29, 2012

(65) Prior Publication Data

US 2014/0001560 A1    Jan. 2, 2014

(51) Int. Cl.
| H01L 27/088 | (2006.01) |
| H01L 21/76 | (2006.01) |
| H01L 27/12 | (2006.01) |
| H01L 21/762 | (2006.01) |

(52) U.S. Cl.
CPC ..... *H01L 27/1207* (2013.01); *H01L 21/76232* (2013.01); *H01L 27/088* (2013.01)

(58) Field of Classification Search
CPC ............... H01L 27/1207; H01L 27/10879
See application file for complete search history.

(56) References Cited

U.S. PATENT DOCUMENTS

| 2008/0157225 A1 | 7/2008 | Datta et al. |
| 2009/0020792 A1 | 1/2009 | Rios et al. |
| 2009/0159972 A1* | 6/2009 | Jakschik et al. ............ 257/350 |
| 2010/0163971 A1* | 7/2010 | Hung et al. ............ 257/327 |
| 2010/0213548 A1* | 8/2010 | Chang et al. ............ 257/348 |
| 2013/0009246 A1* | 1/2013 | Cheng et al. ............ 257/350 |
| 2013/0309832 A1* | 11/2013 | Cheng et al. ............ 438/381 |

FOREIGN PATENT DOCUMENTS

| KR | 20030050678 | 6/2003 |
| KR | 20060075968 | 7/2006 |
| KR | 20110033039 | 3/2011 |

OTHER PUBLICATIONS

International Search Report and Written Opinion for PCT Patent Application No. PCT/US2013/044794 mailed Nov. 19, 2013, 11 pgs.
International Preliminary Report on Patentability from PCT/US2013/044794 mailed Jan. 8, 2015, 8 pgs.
Office Action for Taiwanese Patent Application No. 102121134, mailed Sep. 10, 2015, 16 pgs.

* cited by examiner

*Primary Examiner* — Caleb Henry
*Assistant Examiner* — Mounir Amer
(74) *Attorney, Agent, or Firm* — Blakely, Sokoloff, Taylor & Zafman LLP

(57) ABSTRACT

Isolated and bulk semiconductor devices formed on a same bulk substrate and methods to form such devices are described. For example, a semiconductor structure includes a first semiconductor device having a first semiconductor body disposed on a bulk substrate. The first semiconductor body has an uppermost surface with a first horizontal plane. The semiconductor structure also includes a second semiconductor device having a second semiconductor body disposed on an isolation pedestal. The isolation pedestal is disposed on the bulk substrate. The second semiconductor body has an uppermost surface with a second horizontal plane. The first and second horizontal planes are co-planar.

14 Claims, 15 Drawing Sheets

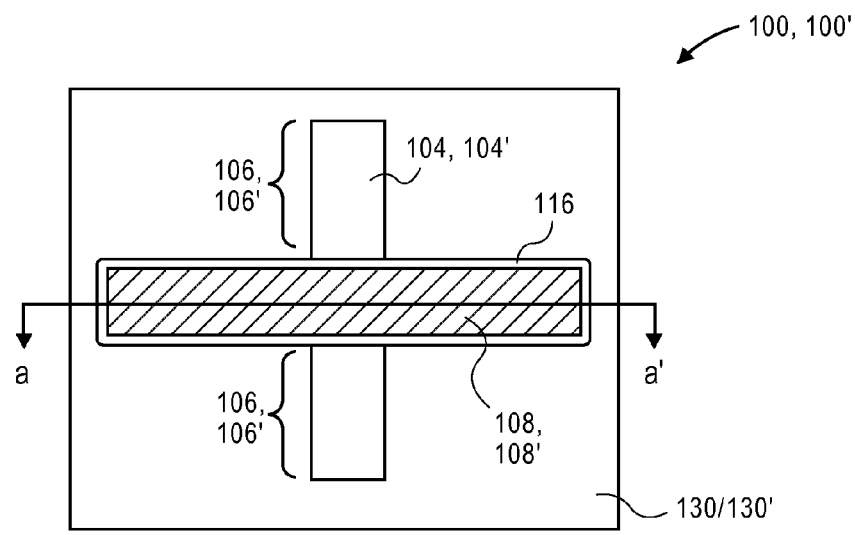
FIG. 1A
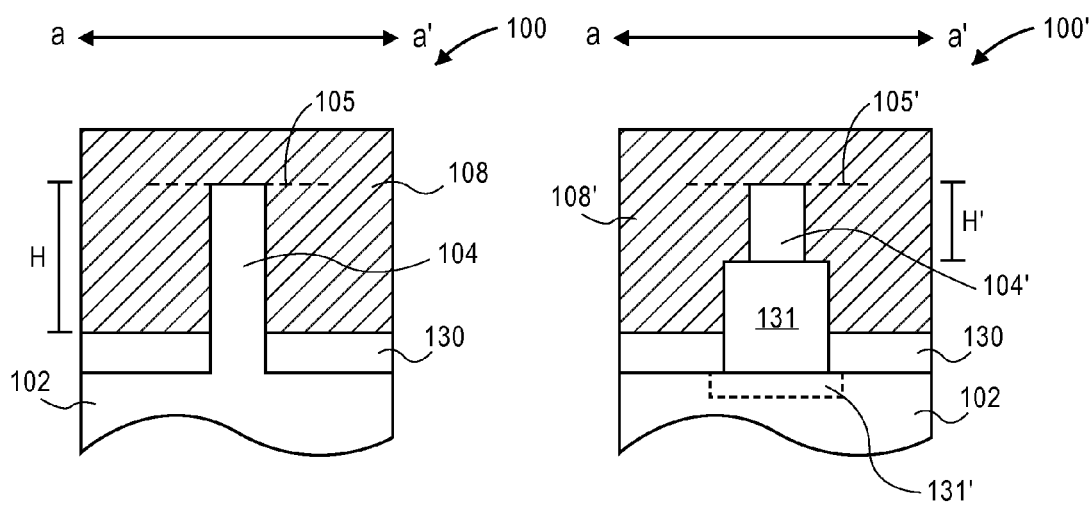
FIG. 1B  FIG. 1B'

ISOLATED AND BULK SEMICONDUCTOR DEVICES FORMED ON A SAME BULK SUBSTRATE

TECHNICAL FIELD

Embodiments of the invention are in the field of semiconductor devices and, in particular, isolated and bulk semiconductor devices formed on a same bulk substrate and methods to form such devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate cap parasitics. Even so, having at least some devices with channels coupled to a bulk substrate may be useful within an integrated circuit.

In another aspect, many different techniques have been attempted to fabricate isolated three-dimensional devices. However, significant improvements are still needed in the area of isolation formation for such semiconductor devices.

BRIEF DESCRIPTION OF THE DRAWINGS

FIG. 1A illustrates a plan view of a semiconductor device, in accordance with an embodiment of the present invention.

FIG. 1B illustrates a cross-sectional view of a semiconductor device of FIG. 1A, as taken along the a-a' axis, in accordance with an embodiment of the present invention.

FIG. 1B' illustrates a cross-sectional view of another semiconductor device of FIG. 1A, as taken along the a-a' axis, in accordance with another embodiment of the present invention.

DESCRIPTION OF THE EMBODIMENTS

Figure 2A:
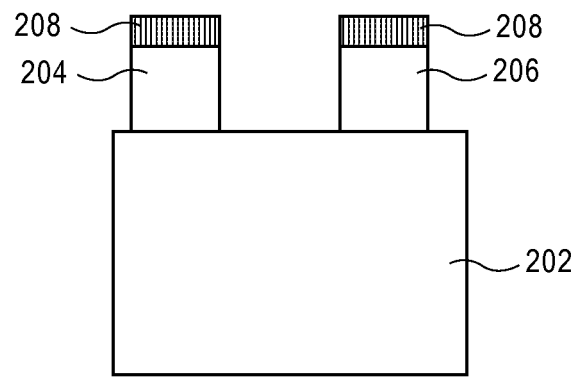
FIGS. 2A-2H illustrate cross-sectional views representing various operations in a method of fabricating a semiconductor structure, in accordance with an embodiment of the present invention.

Isolated and bulk semiconductor devices formed on a same bulk substrate and methods to form such devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to a plurality of semiconductor devices having three-dimensional bodies or active regions (e.g., fins) formed from a bulk substrate, such as a bulk single crystalline silicon substrate. One or more of the plurality of devices is subjected to an under fin oxidation (UFO, described in greater detail below) process to isolate, or at least restrict, the device from the underlying bulk substrate. However, other devices of the plurality of devices are not subjected to a UFO process, enabling formation of multiple device types on a single bulk substrate. Accordingly, one or more embodiments include fabrication processes using a selective (versus global) UFO process to provide selective substrate isolation for targeted devices.

In general, if a plurality of fins for inclusion in semiconductor devices is subjected to a UFO treatment, then every fin will be isolated from an underlying bulk substrate by a formed oxide. The UFO technique is expected to have both advantages and disadvantages typically associated with silicon-on-insulator (SOT) or SOI-like substrates. Specifically, disadvantages may arise due to charging and self heating of certain devices. Furthermore, some device types, e.g., electrostatic discharge (ESD) devices and thermal diodes, may be difficult to fabricate from such SOI based substrates.

Often, a lighting rod is used to form a tap contact or etch ring to connect the foundation substrate to upper metal layers, where needed. By contrast, one or more embodiments described herein enable the fabrication of certain fins that are isolated from an underlying bulk substrate (e.g., by way of formation of a UFO oxide) along with fins that are not isolated from, e.g., they are electrically connected to, the underlying bulk substrate. As such, the need to fabricate taps contacts or etch rings in order to address charging or other issues may be avoided or at least mitigated.

As such, methods to isolate channel or source and drain regions, or both, of semiconductor bodies of select semiconductor devices from an underlying semiconductor substrate are described, along with the resulting structures. In an embodiment, an isolation pedestal is formed between a semiconductor body and a semiconductor substrate. The isolation pedestal may be distinguished from other adjacent isolating material, even if composed of the same material. Approaches described herein may be referred to as under-fin oxidation (UFO) processes. Such processes may be used to suppress or entirely block leakage in a resulting semiconductor device.

More specifically, in an embodiment, a transistor fabrication process involves the formation of an oxide layer that electrically isolates a subfin region of a fin. One or more embodiments of the present invention enable implementation of silicon-on-insulator (SOT) type fins starting with bulk substrates, such as bulk silicon substrates, along with non-isolated devices formed on the bulk substrate. In one such embodiment, isolation is achieved by the formation of an oxide layer under the subfin active region, including the channel region. One or more embodiments of the present invention enable independent facilitation of channel doping from substrate doping since initial fabrication is from a bulk substrate.

Under conventional processing of trigate or fin field effect transistor (fin-FET) transistors from bulk silicon substrates, subfin leakage of at least some of the resulting devices may occur. Such leakage may render difficult the targeting and controlling of $I_{off}$ (off-state source and drain leakage). The leakage may be effectively suppressed by the introduction of an insulating layer at the bottom of the fin, in the area that has poor or no gate control. In an embodiment, the introduction of an insulating material also may enable an easy targeting of channel doping reduction to achieve a lightly doped or fully undoped channel device. Having a buried oxide in the subfin region may also relax the conflicting constraints and simultaneously enable a low-doped fin with high mobility, excellent device electrostatics and elimination of the substrate junction leakage. Also, the presence of an oxide under the source and drain regions may significantly reduce junction leakage.

One or more embodiments of the present invention provide a "cost-effective" solution to improving transistor performance and reducing stand-by power, e.g., for system-on-chip (SOC) ultra-low power devices which are limited by junction leakage in standby mode. Although such benefits may also be achieved doping very highly the subfin region, such doping is difficult to perform without affecting the channel doping and, hence, impacting mobility. Accordingly, one or more embodiments involve the fabrication of, e.g., one or more finFETs or trigate devices based on fins with a buried oxide layer. In one such embodiment, the buried oxide layer isolates the active fin channel from the underlying substrate. Such approaches may be cost-effective solutions since they may begin with bulk substrates and the isolating of the active fin from the substrate may be performed using localized oxidation in the subfin region. The isolated devices may be integrated with non-isolated devices (e.g., devices thermally and/or electrically coupled to the bulk substrate) by performing isolation on only some of the devices present.

Thus, in an aspect, an isolated device and a non-isolated device are fabricated on a common bulk substrate by approaches described herein. In an example, FIG. 1A illustrates a plan view of semiconductor devices 100 and 100', in accordance with an embodiment of the present invention. FIG. 1B illustrates a cross-sectional view of the semiconductor device 100 of FIG. 1A, as taken along the a-a' axis. FIG. 1B' illustrates a cross-sectional view of the semiconductor device 100' of FIG. 1A, as taken along the a-a' axis.

Referring to FIG. 1A, a semiconductor device 100 or 100' includes a semiconductor body 104 or 104', disposed above a bulk substrate (shown in FIGS. 1B and 1B' as 102). The semiconductor body 104 or 104' includes a channel region underneath a gate stack 108 or 108'. The semiconductor body 104 or 104' also includes and a pair of source and drain regions 106 or 106' on either side of the channel region.

Referring to FIG. 1B, the semiconductor device 100 has a height (H) and an uppermost surface with a horizontal plane 105. Referring to FIG. 1B', the semiconductor device 100' has a height (H') and an uppermost surface with a horizontal plane 105'. Referring to both FIGS. 1B and 1B', the semiconductor devices 100 and 100' are formed above the common bulk substrate 102. The horizontal planes 105 and 105' are co-planar. However, the heights H and H' are different. Thus, in an embodiment, a common bulk substrate 102 has disposed thereon devices with differing semiconductor body heights. Furthermore, in an embodiment, device 100' is isolated from the common bulk substrate 102, while device 100 is not, as described in greater detail below.

Referring to FIG. 1B', semiconductor device 100' is isolated from bulk substrate 102 by an isolation pedestal 131. Isolation pedestal 131 may be composed of a material suitable to electrically isolate at least a portion, if not all, of the semiconductor body 104' from the bulk substrate 102. For example, in one embodiment, the isolation pedestal 131 is composed of a dielectric material such as, but not limited to, silicon dioxide, silicon oxy-nitride or silicon nitride. In an embodiment, the isolation pedestal 131 is composed of an oxide of the semiconductor material of the bulk substrate 102. In one such embodiment, the isolation pedestal extends into the substrate to form an extension region 131', indicated by the dashed line in FIG. 1B'. In an alternative embodiment, however, the isolation pedestal 131 is composed of an oxide of a semiconductor material different from the semiconductor material of the bulk substrate 102. Notably, Referring to FIG. 1B, in accordance with an embodiment of the present invention, semiconductor body 104 is not isolated from bulk substrate 102.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions. A "partial isolation pedestal" is one that is not completely isolating, as described in greater detail below in association with FIGS. 5A-5E.

Referring to FIGS. 1B and 1B', the semiconductor device 100 or 100' further includes a dielectric layer 130 disposed between the bulk substrate 102 and each of the semiconductor gates 108 or 108'. In an embodiment, the dielectric layer 130 is common to both devices and, therefore, 130 is effectively continuous across a common substrate 102. In one embodiment, the dielectric layer 130 is composed of a dielectric material such as, but not limited to, silicon dioxide, silicon oxy-nitride or silicon nitride.

Bulk substrate 102 and, hence, semiconductor bodies 104 and 104' may be composed of a semiconductor material that can withstand a manufacturing process and in which charge can migrate. In an embodiment, bulk substrate 102 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 102 is greater than 97%. In another embodiment, bulk substrate 102 is composed of an epitaxial layer grown atop a distinct crystalline substrate, e.g. a silicon epitaxial layer grown atop a boron-doped bulk silicon monocrystalline substrate. Bulk substrate 102 may alternatively be composed of a group III-V material. In an embodiment, bulk substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 102 is composed of a III-V material and the charge-carrier dopant impurity atoms are ones such as, but not limited to, carbon, silicon, germanium, oxygen, sulfur, selenium or tellurium. In another embodiment, bulk substrate 102 and, hence, the semiconductor body 104 or 104' is undoped or only lightly doped.

In an embodiment, the semiconductor device 100 or 100' is a non-planar device such as, but not limited to, a fin-FET or a tri-gate device. In such an embodiment, the semiconducting channel region is composed of or is formed in a three-dimensional body. In one such embodiment, the gate electrode stack 108 or 108' surrounds at least a top surface and a pair of sidewalls of the three-dimensional body, as depicted in FIGS. 1B and 1B'. In another embodiment, at least the channel region is made to be a discrete three-dimensional body, such as in a gate-all-around device. In one such embodiment, the gate electrode stack 108 or 108' completely surrounds the channel region.

In the case of a three-dimensional body 104 or 104', whether isolated or not, the three-dimensional body 104 or 104' may be fabricated from a bulk substrate. In one such embodiment, the three-dimensional body 104 or 104' is formed directly from a bulk substrate and local oxidation is used to form electrically insulative underlying regions. In another alternative embodiment, the device 100 or 100' is formed directly from a bulk substrate and doping is used to form electrically isolated active regions. In one such embodiment, an omega-FET type structure is formed.

As mentioned above, referring to FIGS. 1A, 1B and 1B', in an embodiment, the semiconductor devices 100 or 100' further include respective gate electrode stacks 108 or 108' at least partially surrounding a portion of the semiconductor body 104 or 104' of the device. In one such embodiment, the gate electrode stacks 108 or 108' each include a gate dielectric layer and a gate electrode layer (not shown). In an embodiment, the gate electrode of gate electrode stack 108 or 108' is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconductor body 104 or 104'. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, although not shown, the semiconductor devices 100 or 100' further include a pair of contacts at least partially surrounding respective portions of the semiconductor body 104 or 104', e.g., at least partially surrounding source and drain regions 106 or 106'. The contacts are, in an embodiment, fabricated from a metal species. The metal species may be a pure metal, such as nickel or cobalt, or may be an alloy such as a metal-metal alloy or a metal-semiconductor alloy (e.g., such as a silicide material). In an embodiment, the semiconductor devices 100 or 100' further include spacers 116 (as depicted in FIG. 1A). The spacers 116 may be disposed between the gate electrode stack 108 or 108' and a pair of contacts at least partially surrounding source and drain regions 106 or 106'. In an embodiment, the spacers 116 are composed of an insulative dielectric material such as, but not limited to, silicon dioxide, silicon oxy-nitride or silicon nitride.

Semiconductor device 100 or 100' may be any semiconductor device incorporating a gate, a channel region and a pair of source/drain regions. In an embodiment, semiconductor device 100 or 100' is one such, but not limited to, a MOS-FET, a memory transistor, or a Microelectromechanical System (MEMS). In one embodiment, semiconductor device 100 or 100' is a three-dimensional MOS-FET and is a stand-alone device or is one device in a plurality of nested devices. As will be appreciated for a typical integrated circuit, both N- and P-channel transistors may be fabricated on a single substrate to form a CMOS integrated circuit.

Although the device 100 or 100' described above is for a single device, e.g., an NMOS or a PMOS device, a CMOS architecture may also be formed to include both NMOS and PMOS channel devices disposed on or above the same substrate. A plurality of such NMOS devices, however, may be fabricated to have different semiconductor body heights and/or may be isolated from or coupled to an underlying bulk substrate. Likewise, a plurality of such PMOS devices may be fabricated to have different semiconductor body heights and/or may be isolated from or coupled to an underlying bulk substrate. In an embodiment, semiconductor devices 100 and 100' are formed on a common bulk substrate, have semiconductor bodies composed of silicon, and are both NMOS devices. In another embodiment, semiconductor devices 100 and 100' are formed on a common substrate, have semiconductor bodies composed of silicon germanium, and are both PMOS devices.

Selective semiconductor body isolation may, in an embodiment, be achieved by initiating fabrication on a bulk silicon substrate and patterning a fin using a spacer patterning technique by selective masking an area to be etched. The etching of the fin is performed to the depth needed for subfin isolation (e.g., an operation that sets the height as active) for a particular structure. Various exemplary fabrication approaches are described below, in association with FIGS. 2A-2H, FIGS. 3A-3D, FIGS. 4A-4C, FIGS. 5A-5E, FIGS. 6A-6H, and FIGS. 7A-7I. It is noted that throughout, the bulk substrate and fin material is depicted with a line separating these layers. However, it is to be understood that the fin material may be formed from the bulk substrate material; in such embodiments, the line is merely a visual reference point. In other embodiments, the line represents a distinction between two material layers.

In a first exemplary fabrication approach, FIGS. 2A-2H illustrate cross-sectional views representing various operations in a first method of fabricating a semiconductor structure, in accordance with an embodiment of the present invention.

Figure 2B:
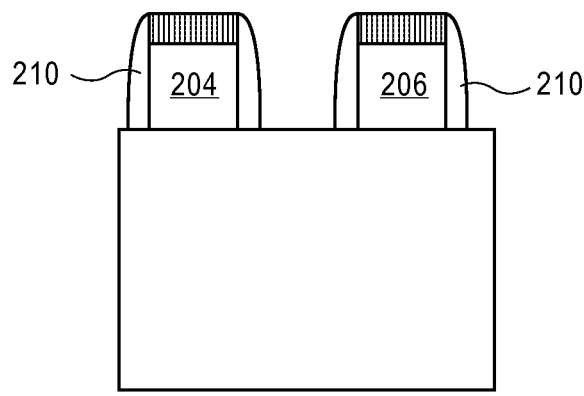
Figure 2C:
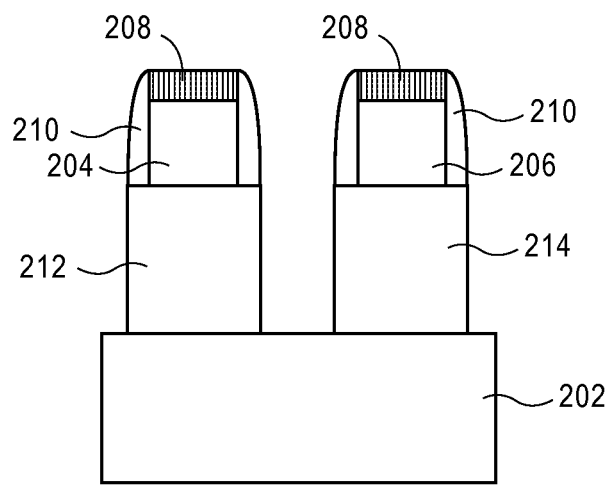
Figure 2D:
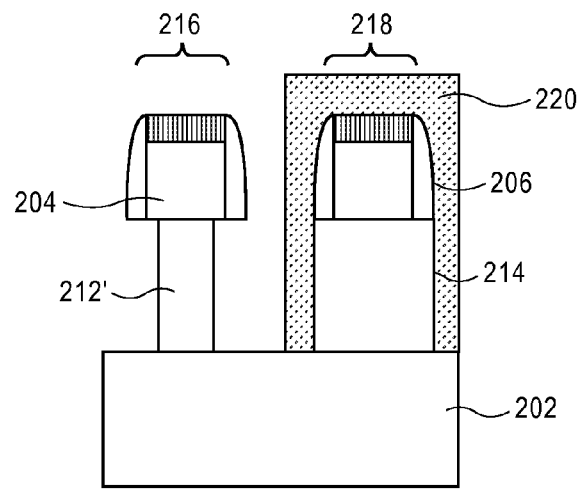
Figure 2E:
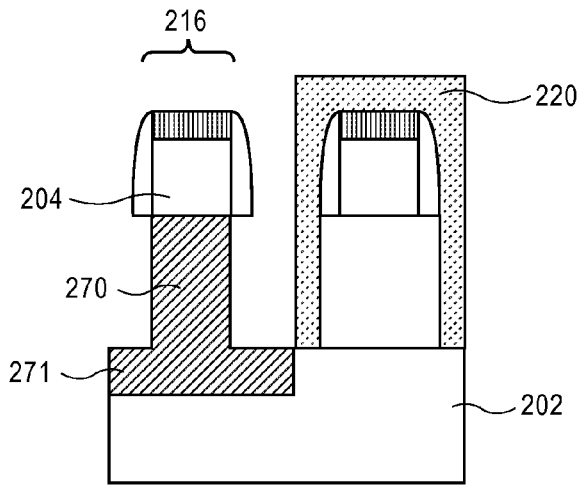
Figure 2F:
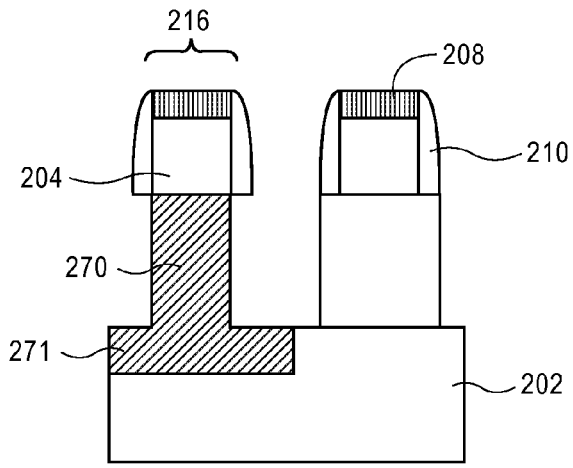
Figure 2G:
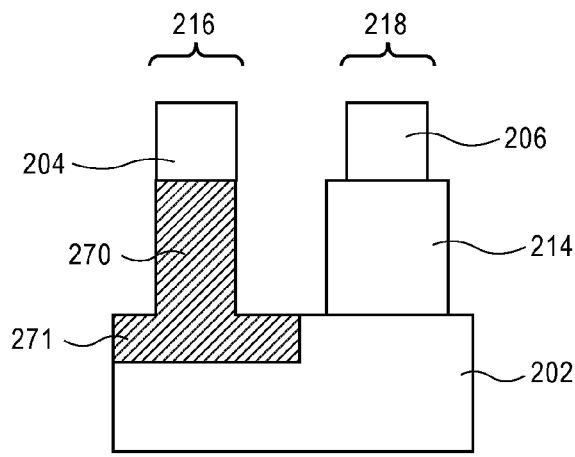
Figure 2H:
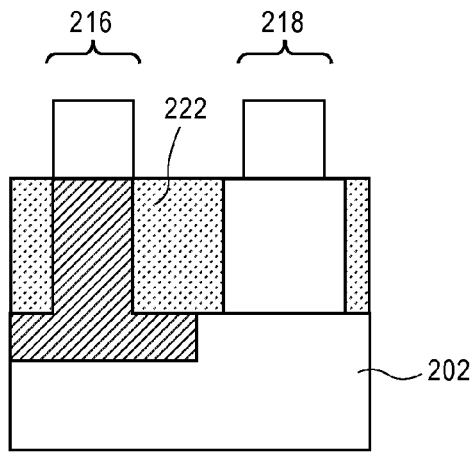

Referring to FIG. 2A, initial portions 204 and 206 of fins are formed by partially patterning a bulk substrate 202, e.g., a bulk single crystalline silicon substrate using a hardmask layer 208. Sidewall spacers 210 are then formed along the sidewalls of the initial portions 204 and 206 of fins, as depicted in FIG. 2B. Referring to FIG. 2C, second portions 212 and 214 of the fins are formed by further etching substrate 202, using the initial portions 204 and 206 of fins, the hardmask layer 208, and the sidewall spacers 210 as a mask. The fin 218 (including initial portion 206 and second portion 214) is then masked with a masking layer 220, while the fin 216 (including initial portion 204 and second portion 212) is exposed, as depicted in FIG. 2D. In a specific embodiment, portion 212 is then reduced in size with an undercut etch to provide narrowed portion 212', as is also depicted in FIG. 2D. Referring to FIG. 2E, portion 212 (or 212' if narrowed) is oxidized by an under fin oxidation (UFO) process to form an isolation pedestal 270. The isolation pedestal isolates portion 204 of fin 216 from the substrate 202. In one embodiment, the UFO process also oxidized a portion of substrate 202 to form an extension portion 271 of the isolation pedestal, as is also depicted in FIG. 2E. The mask layer 220 is then removed, as depicted in FIG. 2F. Referring to FIG. 2G, the hardmask 208 and spacers 210 are removed, exposing fins 216 and 218. A planarizing oxide layer 222 is then formed between fins 216 and 218, and over substrate 202, as depicted in FIG. 2H. The oxide layer 222 may be used for subsequent isolation of a gate electrode from the bulk substrate 202. It is to be understood that, alternatively, the hardmask 208 and spacers 210 may be preserved through the formation of the planarizing oxide layer 222.

Referring again to FIG. 2E, in an embodiment, the exposed portions of substrate 202 are oxidized to form the intervening dielectric layer 270 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof. In another embodiment, in place of UFO, selective removal of a material at the bottom of the fin (e.g., a material that has been previously deposited on the silicon wafer before an additional fin material deposition, such as silicon germanium on a silicon substrate) is performed and replaced with a dielectric material, such as silicon dioxide or silicon nitride. In either the UFO case or the selective material removal case, the location where reoxidation or material replacement is performed can vary. For example, in one such embodiment, the reoxidation or material removal is carried out post gate etch, post spacer etch, at an undercut location, at a replacement gate operation, or at a through contact operation, or a combination thereof.

In a second exemplary fabrication approach, FIGS. 3A-3D illustrate cross-sectional views representing various operations in a second method of fabricating a semiconductor structure, in accordance with an embodiment of the present invention.

Figure 3A:
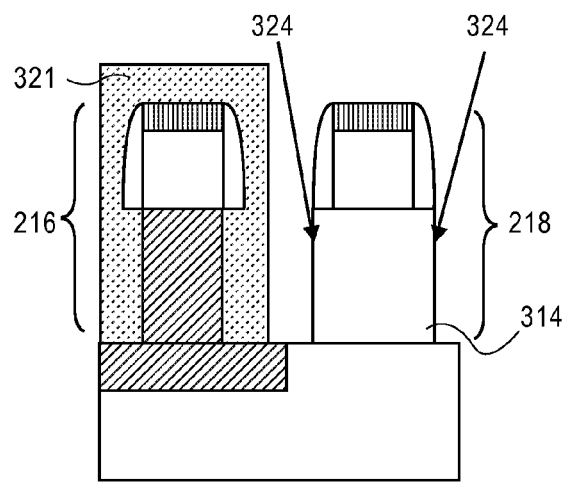
FIGS. 3A-3D illustrate cross-sectional views representing various operations in a method of fabricating a semiconductor structure, in accordance with an embodiment of the present invention.
Figure 3B:
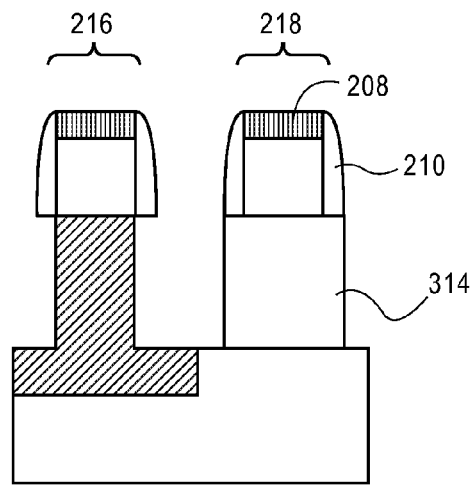
Figure 3C:
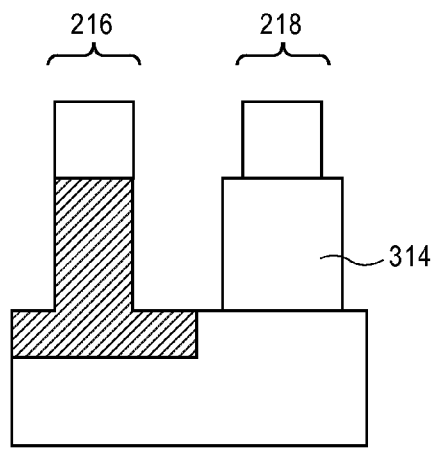
Figure 3D:
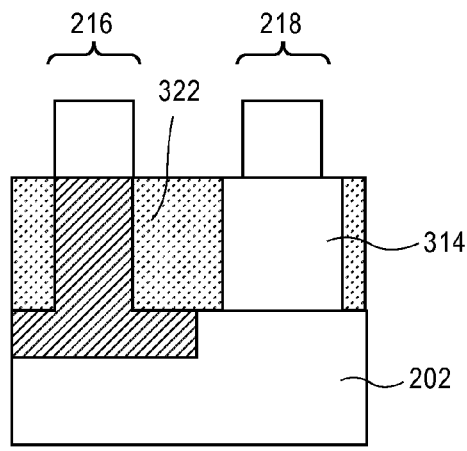

Referring to FIG. 3A, using FIG. 2F as a starting point, a second mask layer 321 is formed to protect fin 216, while leaving fin 218 exposed. An angled implant (e.g., a well implant) 324 is then used to form doped region 214 to formed doped portion 314 of fin 218. The mask 321 is then removed, as depicted in FIG. 3B. Referring to FIG. 3C, the hardmask 208 and spacers 210 are removed, exposing fins 216 and 218. A planarizing oxide layer 322 is then formed between fins 216 and 218, and over substrate 202. The oxide layer 322 may be used for subsequent isolation of a gate electrode from the bulk substrate 202. In an embodiment, the approach described in association with FIGS. 3A-3D provides a route to dope a non-isolated fin, e.g., for fabricating diodes.

Figure 4A:
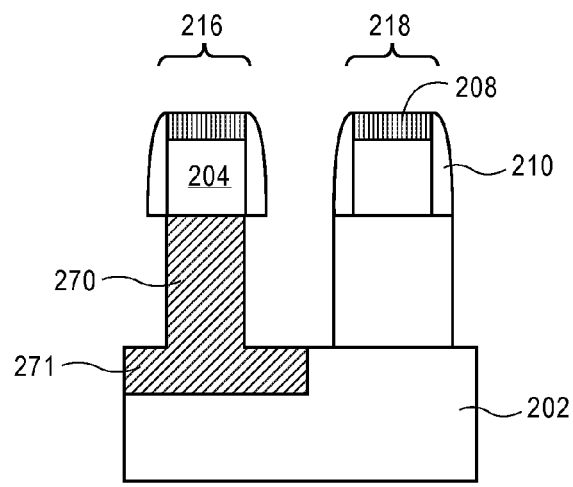
FIGS. 4A-4C illustrate cross-sectional views representing various operations in a method of fabricating a semiconductor structure, in accordance with an embodiment of the present invention.
Figure 4B:
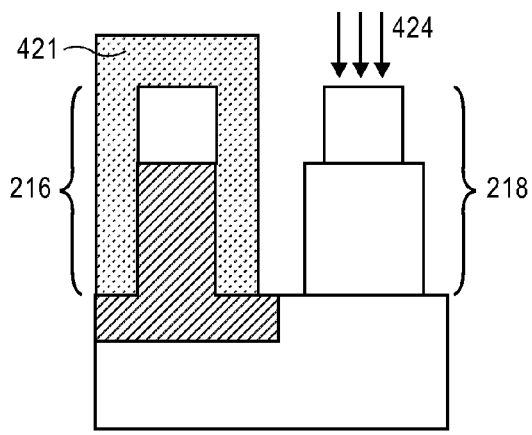
Figure 4C:
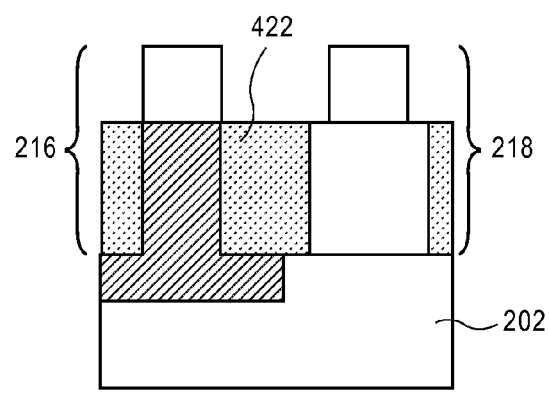

In a third exemplary fabrication approach, FIGS. 4A-4C illustrate cross-sectional views representing various operations in a third method of fabricating a semiconductor structure, in accordance with an embodiment of the present invention.

Referring to FIG. 4A, the structure described in association with FIG. 2F is provided as a starting point. The spacers 210 and hardmask layer 208 are removed, and a mask layer 421 is formed to protect fin 216 and expose fin 218, as depicted in FIG. 4B. An implant (e.g., a well implant) 424 is then used to dope all of fin 218, as is also depicted in FIG. 4B. Referring to FIG. 4C, the mask layer 421 is removed and a planarizing oxide layer 422 is then formed between fins 216 and 218, and over substrate 402.

In a fourth exemplary fabrication approach, FIGS. 5A-5E illustrate cross-sectional views representing various operations in a first method of fabricating a semiconductor structure, in accordance with an embodiment of the present invention.

Figure 5A:
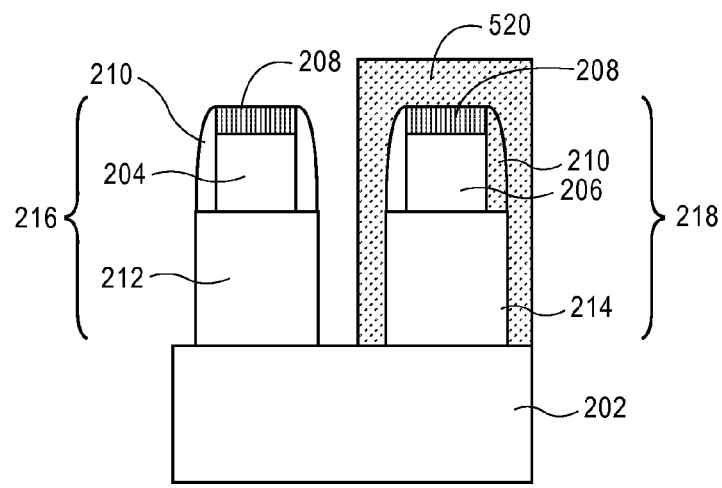
FIGS. 5A-5E illustrate cross-sectional views representing various operations in a method of fabricating a semiconductor structure, in accordance with an embodiment of the present invention.
Figure 5B:
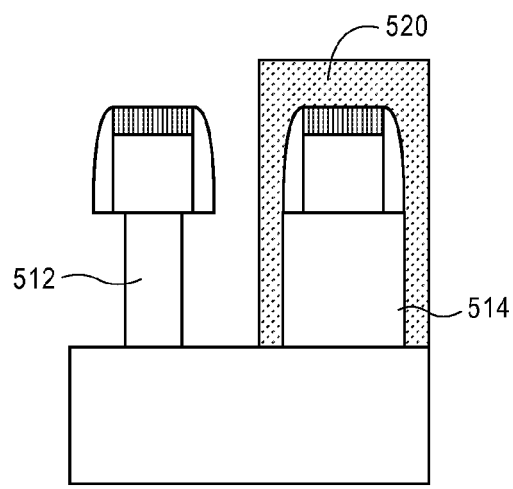
Figure 5C:
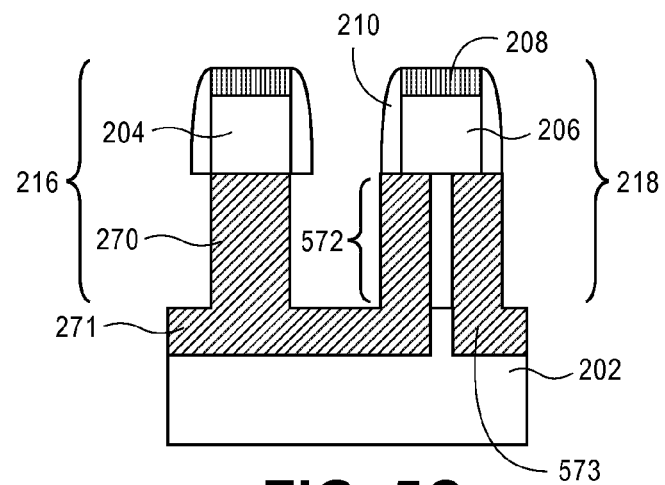
Figure 5D:
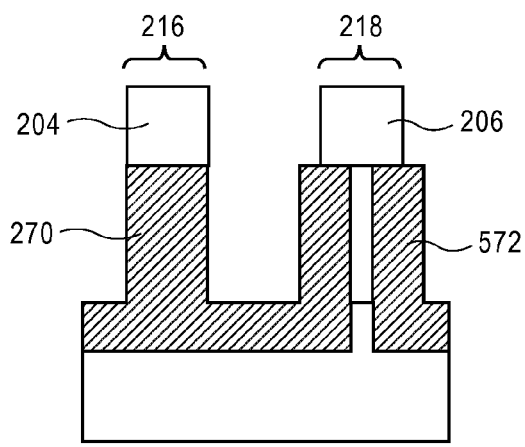
Figure 5E:
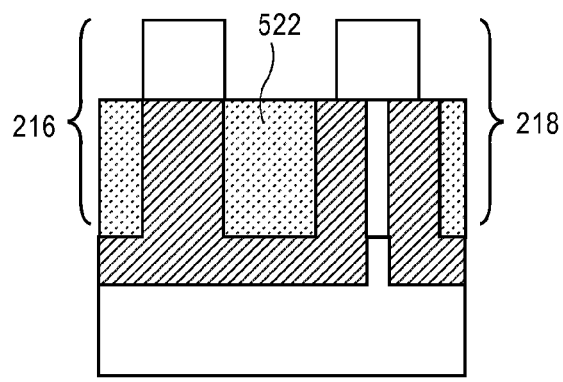

Referring to FIG. 5A, using FIG. 2C as a starting point, the fin 218 (including initial portion 206 and second portion 214) is masked with a masking layer 520, while the fin 216 (including initial portion 204 and second portion 212). Portion 212 is then reduced in size with an undercut etch to provide narrowed portion 512, as depicted in FIG. 5B. Referring to FIG. 5C, mask 520 is removed and, subsequently, both portions 512 and 514 are oxidized by an under fin oxidation (UFO) process. The UFO process is timed to form an isolation pedestal 270. The isolation pedestal isolates portion 204 of fin 216 from the substrate 202. In one embodiment, the UFO process also oxidizes a portion of substrate 202 to form an extension portion 271 of the isolation pedestal 270, as is also depicted in FIG. 5C. However, the UFO process is also timed to form only a partial isolation pedestal 572. The partial isolation pedestal 572 only partially isolates portion 206 of fin 218 from the substrate 202. In one embodiment, the UFO process also oxidizes a portion of substrate 202 to form an extension portion 573 of the partial isolation pedestal 572, as is also depicted in FIG. 5C. The hardmask layer 208 and spacers 210 are then removed, as depicted in FIG. 5D. Referring to FIG. 5E, a planarizing oxide layer 522 is then formed between fins 216 and 218, and over substrate 202.

In a fifth exemplary fabrication approach, FIGS. 6A-6H illustrate cross-sectional views representing various operations in a fifth method of fabricating a semiconductor structure, in accordance with an embodiment of the present invention.

Figure 6A:
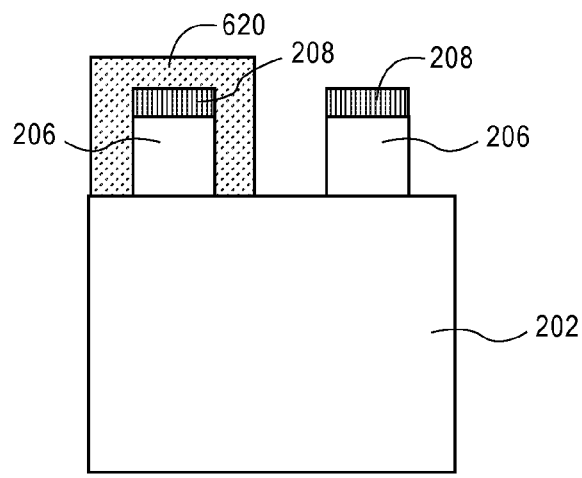
FIGS. 6A-6H illustrate cross-sectional views representing various operations in a method of fabricating a semiconductor structure, in accordance with an embodiment of the present invention.
Figure 6B:
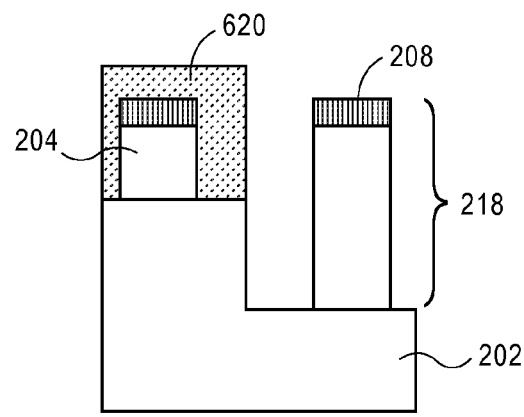
Figure 6C:
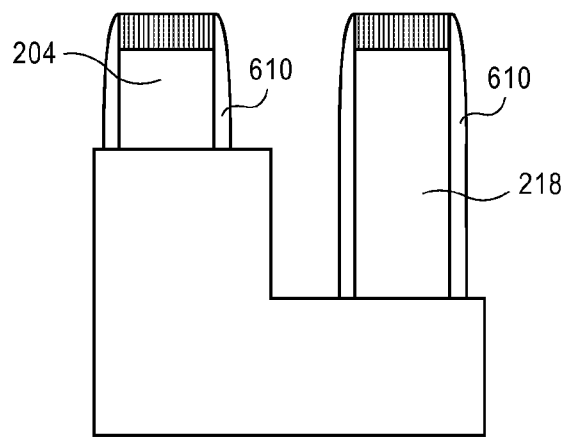
Figure 6D:
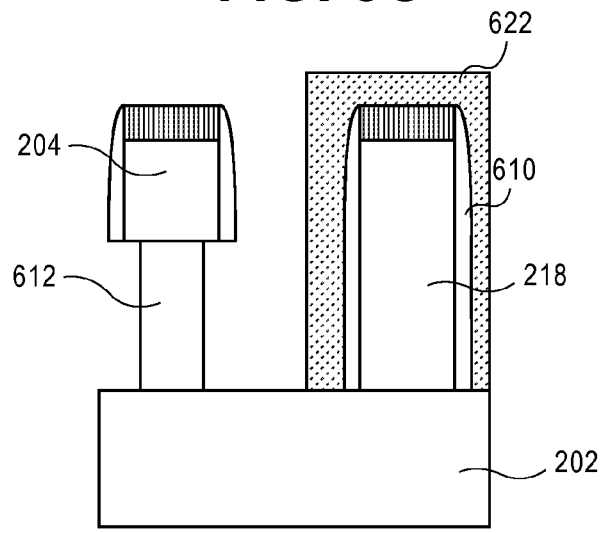
Figure 6E:
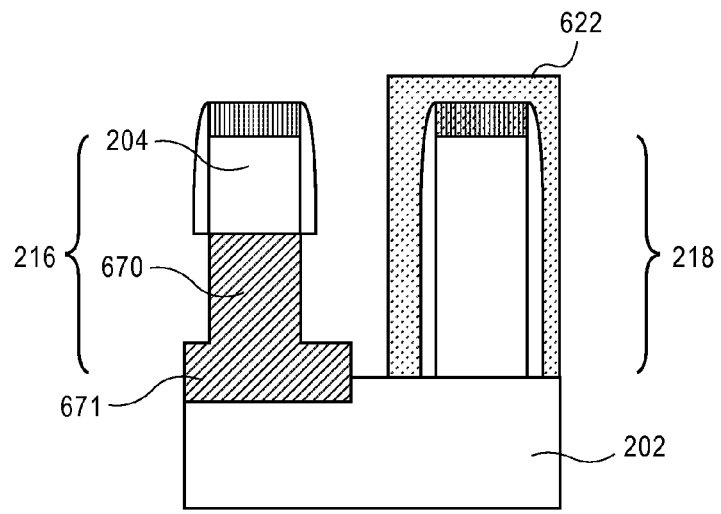
Figure 6F:
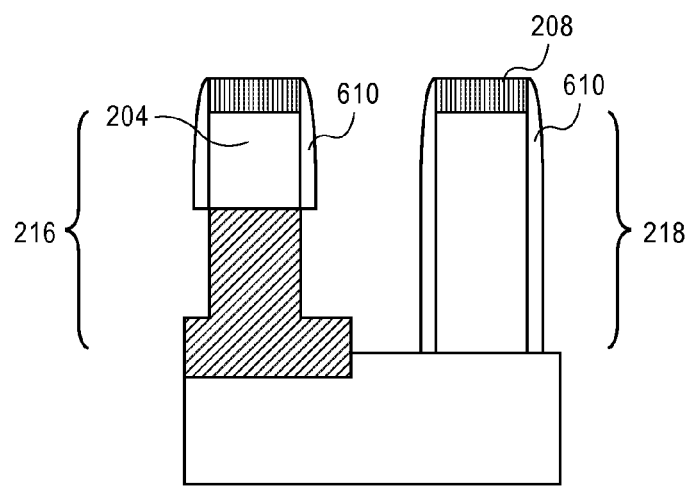
Figure 6G:
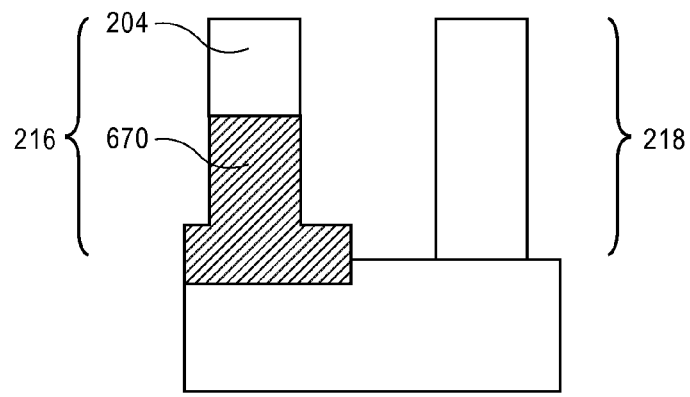
Figure 6H:
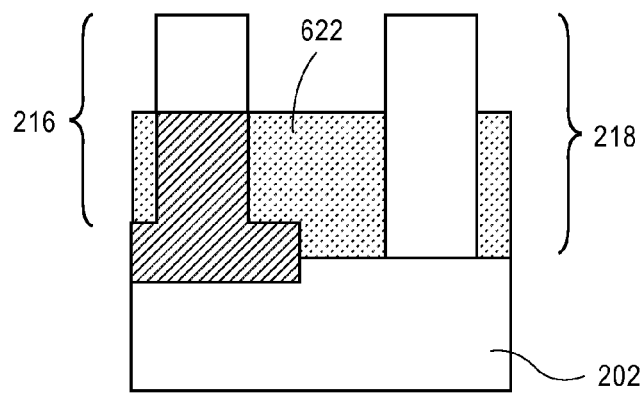

Referring to FIG. 6A, using FIG. 2A as a starting point, a mask layer 620 is formed to protect portion 204 and expose portion 206. The region substrate 202 not protected by mask 620 or portion 206 (and hardmask 208) is extended by further etching of the substrate 202, to form an extended fin 218, as depicted in FIG. 6B. Referring to FIG. 6C, sidewall spacers 610 are then formed adjacent the sidewalls of portion 204 and fin 218. The fin 218 is then masked with mask layer 622 and the region of substrate 202 under portion 204 is undercut to form region 612 of fin 216, as depicted in FIG. 6D. Referring to FIG. 6E, portion 612 is oxidized by an under fin oxidation (UFO) process to form an isolation pedestal 670. The isolation pedestal 670 isolates portion 204 of fin 216 from the substrate 202. In one embodiment, the UFO process also oxidized a portion of substrate 202 to form an extension portion 671 of the isolation pedestal, as is also depicted in FIG. 6E. The mask layer 622 is then removed, as depicted in FIG. 6F. Referring to FIG. 6G, the hardmask 208 and spacers 610 are removed, exposing fins 216 and 218. A planarizing oxide layer 622 is then formed between fins 216 and 218, and over substrate 202, as depicted in FIG. 6H.

In a sixth exemplary fabrication approach, FIGS. 7A-7I illustrate cross-sectional views representing various operations in a sixth method of fabricating a semiconductor structure, in accordance with an embodiment of the present invention.

Figure 7A:
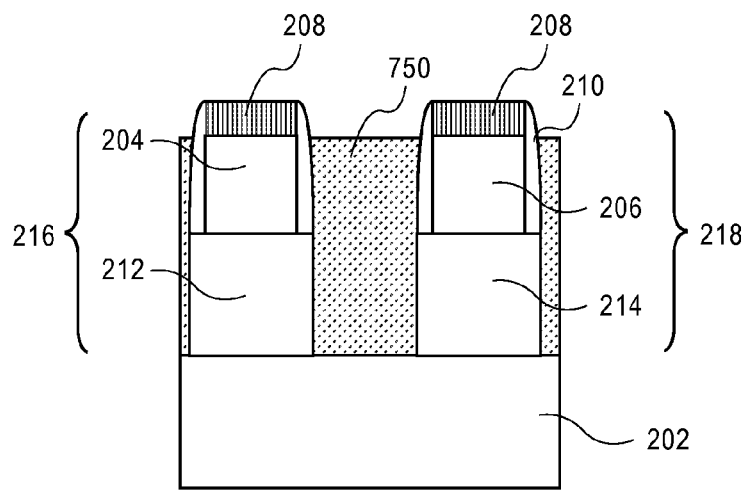
FIGS. 7A-7I illustrate cross-sectional views representing various operations in a method of fabricating a semiconductor structure, in accordance with an embodiment of the present invention.
Figure 7B:
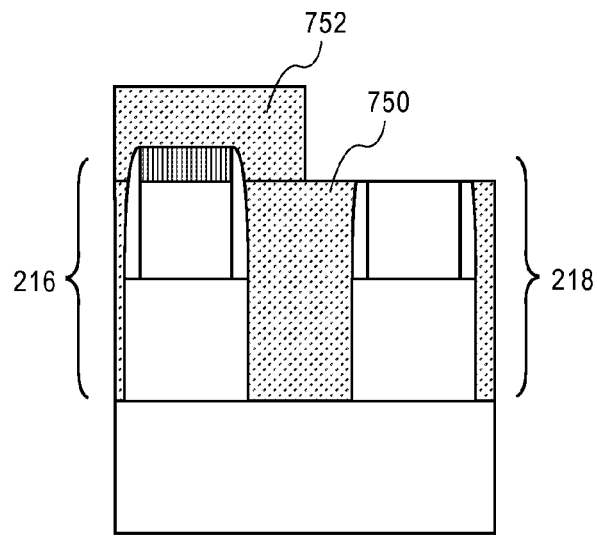
Figure 7C:
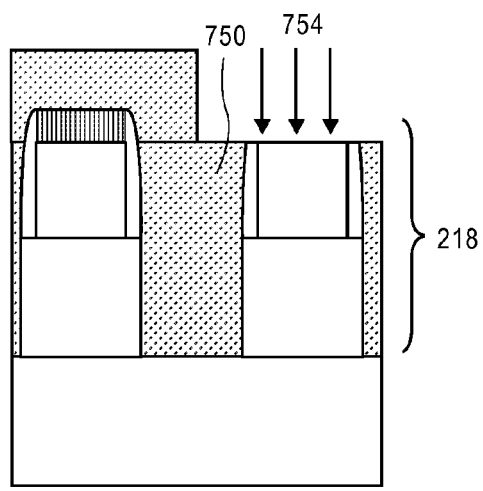
Figure 7D:
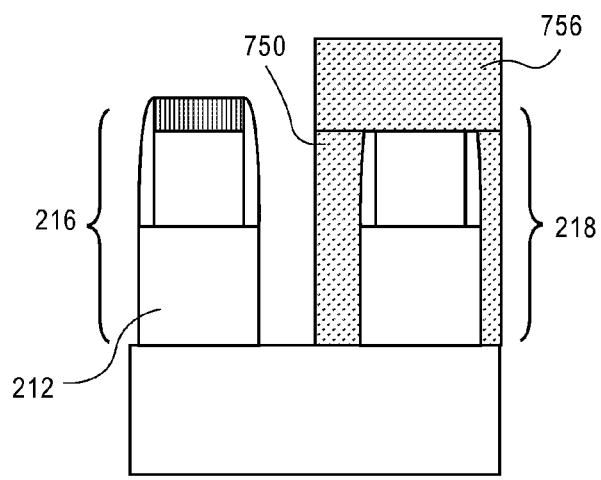
Figure 7E:
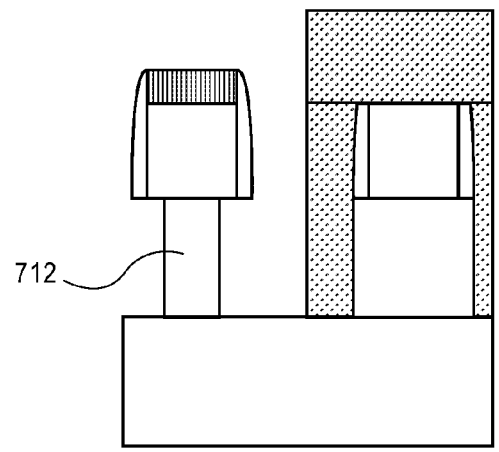
Figure 7F:
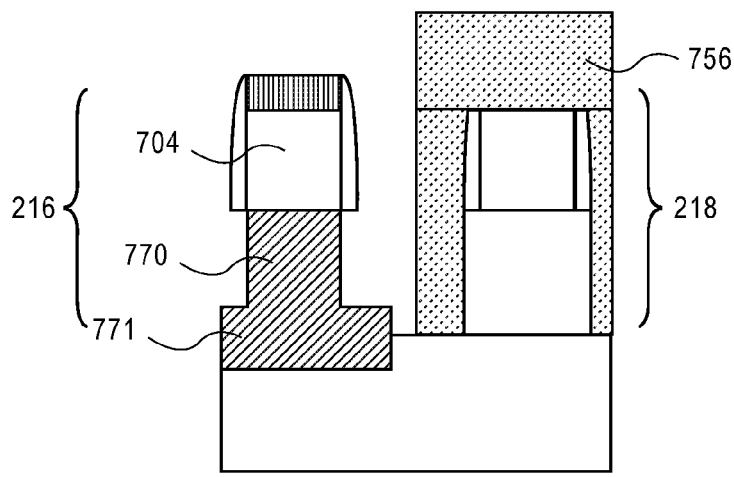
Figure 7G:
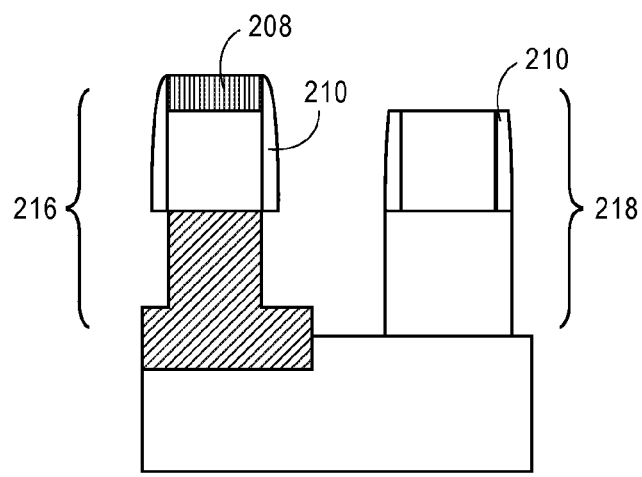
Figure 7H:
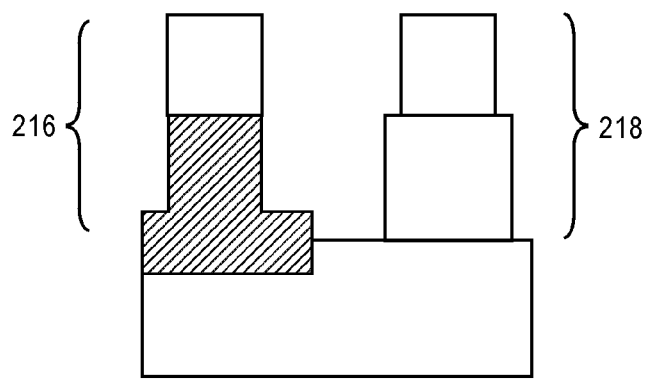
Figure 7I:
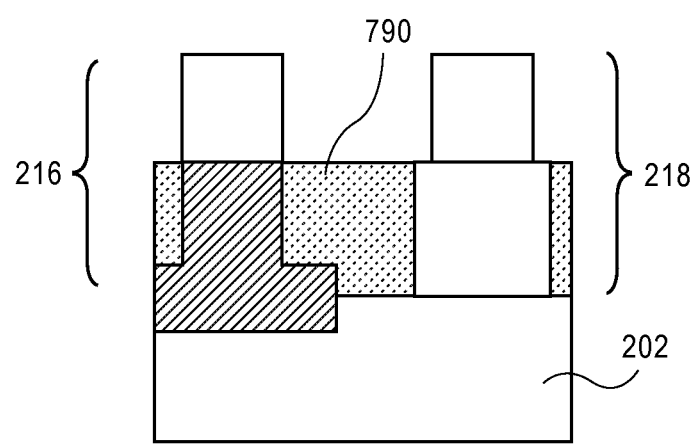

Referring to FIG. 7A, using the structure of FIG. 2C as a starting point, a planarizing oxide 750 is formed between fins 216 and 218. The remaining exposed portion of fin 216 is masked with mask layer 752 and the hardmask 208 of fin 218 is removed, as depicted in FIG. 7B. Referring to FIG. 7C, an implant (e.g., a well implant) 754 is then used to dope fin 218. The mask layer 752 is then removed, a new mask layer 756 formed to protect fin 218, and a portion of planarizing oxide 750 etched to expose 216, as depicted in FIG. 7D. Referring to FIG. 7E, portion 212 is then reduced in size with an undercut etch to provide narrowed portion 712. Portions 712 is then oxidized by an under fin oxidation (UFO) process, as depicted in FIG. 7F. The UFO process is timed to form an isolation pedestal 770. The isolation pedestal 770 isolates portion 204 of fin 216 from the substrate 202. In one embodiment, the UFO process also oxidizes a portion of substrate 202 to form an extension portion 771 of the isolation pedestal 770, as is also depicted in FIG. 7F. Referring to FIG. 7G, mask layer 756 is then removed. Remaining hardmask layer 208 and spacers 210 are also removed, as depicted in FIG. 7H. Referring to FIG. 7I, a second planarizing oxide layer 790 is then formed between fins 216 and 218, and over substrate 202.

The above process schemes illustrated may be continued through to final device fabrication, e.g., gate electrode formation, source and drain region formation, and contact formation. Accordingly, one or more embodiments described herein target selective isolation of certain devices through a bottom-up approach. That is, each device has a top active region surface in the same plane as the top active region surface of other devices, even though only some devices may undergo isolation from the underlying bulk substrate. As for tailoring of device height (e.g., active region height), the difference occurs in how proximate the bottom of the active region of each device is to an underlying common substrate. The bottom-up approach, as opposed to a top-down removal approach may prove to provide the best performance. For example, FEM circuits may exhibit an advantage in delay and power for bottom up approach (e.g., through delay increase relative to a full fin or power reduction relative to full fin.

In an embodiment, one or more approaches described above enables fabrication of combinations of devices with different doping schemes. For example, in one embodiment, an isolated device is undoped and formed on the same bulk substrate as a non-isolated device that is doped. In another embodiment, an isolated device is doped and formed on the same bulk substrate as a non-isolated device that is undoped. In another embodiment, an isolated device is doped and formed on the same bulk substrate as a non-isolated device that is also doped. In another embodiment, an isolated device is undoped and formed on the same bulk substrate as a non-isolated device that is also undoped. In an embodiment, the term "undoped" as used herein indicates that no extra doping operation is performed on a fin or region of a fin beyond the doping provided in the starting bulk substrate, e.g., no heavy doping added to light or intrinsic doping levels of staring bulk substrate.

Embodiments described herein may enable improved performance on 14 nm node products and reduce standby leakage, e.g. for 14 nm node system-on-chip (SOC) products with extremely stringent standby power requirements. Embodiments described herein may allow better cell rebalancing and so reduction of Vccmin. The process flows described herein may be applicable to tri-gate and fin-FET type devices, or subsets thereof such as omega-gate, pi gate or fin with gate all around transistors.

Additionally, one or more embodiments of the present invention include use of an under fin oxide (UFO) process methodology to selectively isolate the active diffusion regions of select devices among a plurality of devices on a common bulk substrate. Under conventional processing of trigate or FIN-FET transistors from bulk silicon substrates, subfin leakage of all the resulting devices may occur. Such leakage may render difficult the targeting and controlling of $I_{off}$ (off-state source and drain leakage). The leakage may be effectively suppressed by the introduction of an insulating layer at the bottom of the fin, in the area that has poor or no gate control. Thus, in an embodiment, and as described above, the introduction of an insulating material also may enable an easy targeting of channel doping reduction to achieve a lightly doped or fully undoped channel device. Having a buried oxide in the sub-fin region may also relax the conflicting constraints and simultaneously enable a low-doped fin with high mobility, excellent device electrostatics and elimination of the substrate junction leakage. Also, the presence of an oxide under the source and drain regions may significantly reduce junction leakage. However, not all devices need be or should be isolated. It may be desirable to retain certain devices in thermal and/or electrical contact with the common bulk substrate for, e.g., electrical or thermal communication with the bulk substrate. Thus, in an embodiment, fabrication begins with a commercially available epitaxial (EPI) bulk wafer or substrate and then integrating in a selected area silicon fins that are not electrically connected to substrate by providing an oxide in the subfin area. In other selected areas, silicon fins having a silicon substrate connection are fabricated.

Figure 8:
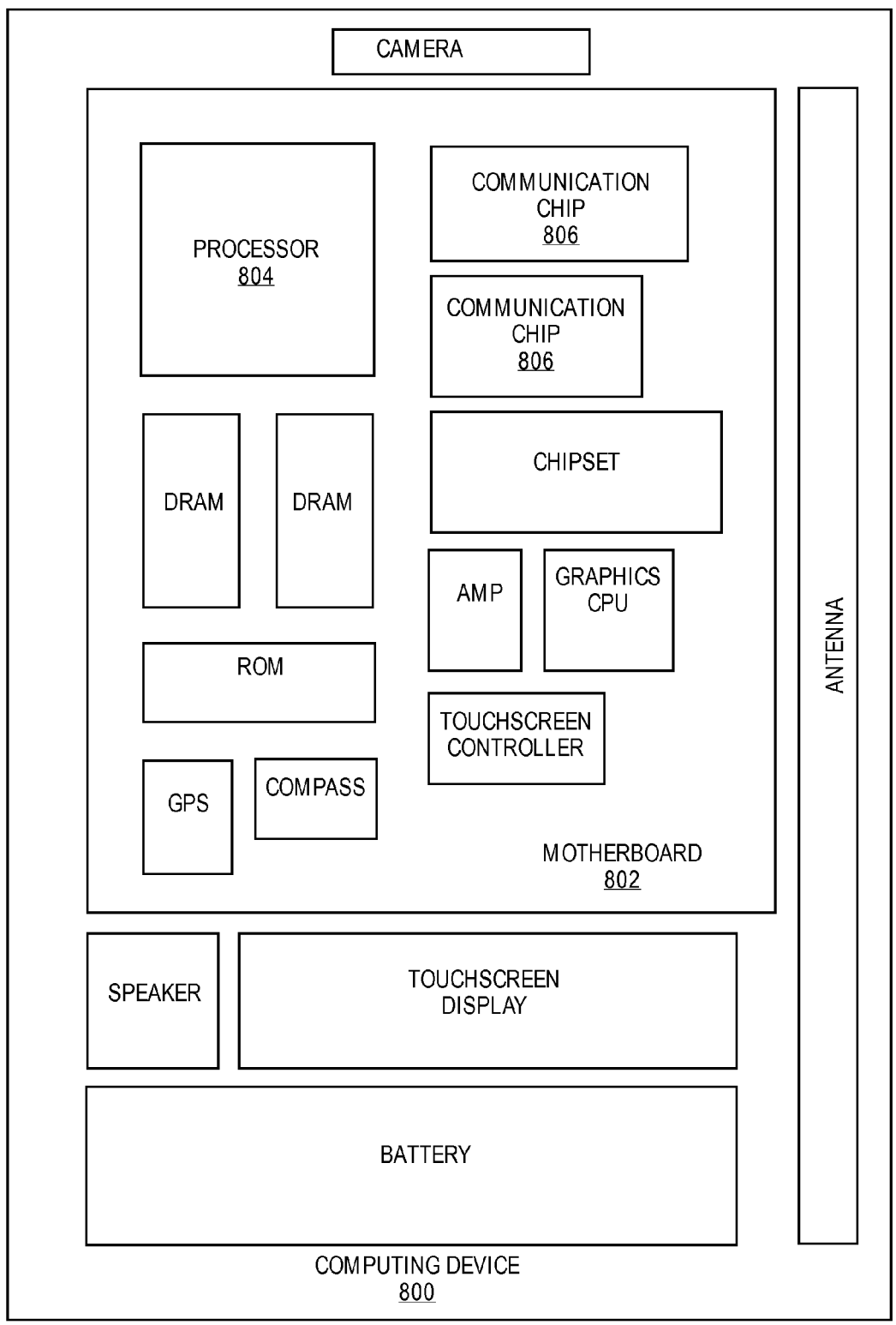
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments of the present invention include isolated and bulk semiconductor devices formed on a same bulk substrate and methods to form such devices.

In an embodiment, a semiconductor structure includes a first semiconductor device having a first semiconductor body disposed on a bulk substrate. The first semiconductor body has an uppermost surface with a first horizontal plane. The semiconductor structure also includes a second semiconductor device having a second semiconductor body disposed on an isolation pedestal. The isolation pedestal is disposed on the bulk substrate. The second semiconductor body has an uppermost surface with a second horizontal plane. The first and second horizontal planes are co-planar.

In one embodiment, the isolation pedestal is composed of an oxide of the material of the bulk substrate.

In one embodiment, the bulk substrate is a bulk single crystalline silicon substrate, and the isolation pedestal is composed of silicon dioxide.

In one embodiment, the semiconductor structure further includes an isolation pedestal extension region disposed in the bulk substrate, below the isolation pedestal.

In one embodiment, the first semiconductor body is doped and the second semiconductor body is undoped.

In one embodiment, the first semiconductor body is undoped and the second semiconductor body is doped.

In one embodiment, the first and second semiconductor devices are devices such as, but not limited to, tri-gate devices or fin-FET devices.

In one embodiment, the first semiconductor device further includes a first gate electrode stack at least partially surrounding a portion of the first semiconductor body. The second semiconductor device further includes a second gate electrode stack at least partially surrounding a portion of the second semiconductor body.

In one embodiment, the first and second gate electrode stacks each include a high-K gate dielectric layer and a metal gate electrode layer.

In an embodiment, a semiconductor structure includes a first semiconductor device having a first semiconductor body disposed on a partial isolation pedestal disposed on a bulk substrate. The first semiconductor body has an uppermost surface with a first horizontal plane. The semiconductor structure also includes a second semiconductor device having a second semiconductor body disposed on an isolation pedestal. The isolation pedestal is disposed on the bulk substrate. The second semiconductor body has an uppermost surface with a second horizontal plane. The first and second horizontal planes are co-planar.

In one embodiment, the isolation pedestal and the partial isolation pedestal are composed of an oxide of the material of the bulk substrate.

In one embodiment, the bulk substrate is a bulk single crystalline silicon substrate, and the isolation pedestal and partial isolation pedestal are composed of silicon dioxide.

In one embodiment, the semiconductor structure further includes a first isolation pedestal extension region disposed in the bulk substrate, below the isolation pedestal, and a second isolation pedestal extension region disposed in the bulk substrate, below the partial isolation pedestal.

In one embodiment, the first semiconductor body is doped and the second semiconductor body is undoped.

In one embodiment, the first semiconductor body is undoped and the second semiconductor body is doped.

In one embodiment, the first and second semiconductor devices are devices such as, but not limited to, tri-gate devices or fin-FET devices.

In one embodiment, the first semiconductor device further includes a first gate electrode stack at least partially surrounding a portion of the first semiconductor body. The second semiconductor device further includes a second gate electrode stack at least partially surrounding a portion of the second semiconductor body.

In one embodiment, the first and second gate electrode stacks each include a high-K gate dielectric layer and a metal gate electrode layer.

In an embodiment, a method of fabricating a semiconductor structure includes forming first and second semiconductor bodies on a bulk substrate. The first and second semiconductor bodies are formed from the bulk substrate. The method also includes forming, from the first semiconductor body, an isolation pedestal between the first semiconductor body and the bulk substrate, but not forming an isolation pedestal between the second semiconductor body and the bulk substrate. The method also includes forming a first semiconductor device to include the first semiconductor body. The method also includes forming a second semiconductor device to include the second semiconductor body.

In one embodiment, forming the isolation pedestal includes forming an oxide of the material of the bulk substrate.

In one embodiment, the bulk substrate is a bulk single crystalline silicon substrate, and the isolation pedestal is composed of silicon dioxide.

In one embodiment, the method further includes forming an isolation pedestal extension region in the bulk substrate, below the isolation pedestal.

In one embodiment, the method further includes forming, from the second semiconductor body, a partial isolation pedestal between the second semiconductor body and the bulk substrate.

In one embodiment, the method further includes doping the first semiconductor body but not the second semiconductor body.

In one embodiment, the method further includes doping the second semiconductor body but not the first semiconductor body.

What is claimed is:

1. A semiconductor structure, comprising:
   a first semiconductor device comprising a first semiconductor body disposed on and electrically connected to a bulk semiconductor substrate, the first semiconductor body having an uppermost surface with a first horizontal plane;
   a second semiconductor device comprising a second semiconductor body disposed on an isolation pedestal disposed on and electrically isolating the second semiconductor body from the bulk semiconductor substrate, the second semiconductor body having an uppermost surface with a second horizontal plane, wherein the first and second horizontal planes are co-planar; and
   a dielectric layer disposed on the bulk semiconductor substrate and having an uppermost surface below an uppermost surface of the isolation pedestal, wherein the dielectric layer is laterally adjacent to and in contact with the isolation pedestal, and wherein the bulk semiconductor substrate is a bulk single crystalline silicon substrate, the isolation pedestal comprises silicon dioxide, and the dielectric layer comprises silicon oxy-nitride or silicon nitride.

2. The semiconductor structure of claim 1, wherein the first semiconductor body is doped and the second semiconductor body is undoped.

3. The semiconductor structure of claim 1, wherein the first semiconductor body is undoped and the second semiconductor body is doped.

4. The semiconductor structure of claim 1, wherein the first and second semiconductor devices are devices selected from the group consisting of tri-gate devices and fin-FET devices.

5. The semiconductor structure of claim 1, wherein the first semiconductor device further comprises a first gate electrode stack at least partially surrounding a portion of the first semiconductor body, and the second semiconductor device further comprises a second gate electrode stack at least partially surrounding a portion of the second semiconductor body.

6. The semiconductor structure of claim 5, wherein the first and second gate electrode stacks each comprise a high-K gate dielectric layer and a metal gate electrode layer.

7. The semiconductor structure of claim 1, wherein the dielectric layer comprises silicon oxy-nitride.

8. The semiconductor structure of claim 1, wherein the dielectric layer comprises silicon nitride.

9. A semiconductor structure, comprising:
   a first semiconductor device comprising a first semiconductor body disposed on and electrically connected to a bulk semiconductor substrate, the first semiconductor body having an uppermost surface with a first horizontal plane;
   a second semiconductor device comprising a second semiconductor body disposed on an isolation pedestal disposed on and electrically isolating the second semiconductor body from the bulk semiconductor substrate, the second semiconductor body having an uppermost surface with a second horizontal plane, wherein the first and second horizontal planes are co-planar, and wherein the isolation pedestal comprises a first dielectric material; and
   a dielectric layer disposed on the bulk semiconductor substrate and having an uppermost surface below an uppermost surface of the isolation pedestal, the dielectric layer comprising a second dielectric material different from the first dielectric material, wherein the dielectric layer is laterally adjacent to and in contact with the isolation pedestal.

10. The semiconductor structure of claim 9, wherein the first semiconductor body is doped and the second semiconductor body is undoped.

11. The semiconductor structure of claim 9, wherein the first semiconductor body is undoped and the second semiconductor body is doped.

12. The semiconductor structure of claim 9, wherein the first and second semiconductor devices are devices selected from the group consisting of tri-gate devices and fin-FET devices.

13. The semiconductor structure of claim 9, wherein the first semiconductor device further comprises a first gate electrode stack at least partially surrounding a portion of the first semiconductor body, and the second semiconductor device further comprises a second gate electrode stack at least partially surrounding a portion of the second semiconductor body.

14. The semiconductor structure of claim 13, wherein the first and second gate electrode stacks each comprise a high-K gate dielectric layer and a metal gate electrode layer.

* * * * *